United States Patent [19]

Furtek

[11] Patent Number: 4,750,664
[45] Date of Patent: Jun. 14, 1988

[54] APPARATUS AND METHOD FOR THE REPAIR OF PRINTED CIRCUIT BOARDS

[76] Inventor: Edward J. Furtek, 80 Sanborn Rd., E. Kingston, N.H. 03867

[21] Appl. No.: 75,622

[22] Filed: Jul. 20, 1987

[51] Int. Cl.$^4$ .................... B23K 29/00; B23K 3/04
[52] U.S. Cl. ........................... 228/102; 228/191; 228/264; 228/8; 228/20; 228/45; 228/56.5
[58] Field of Search .............. 228/102, 103, 191, 264, 228/8, 20, 45, 56.5

[56] References Cited

U.S. PATENT DOCUMENTS

| | | | |
|---|---|---|---|
| 4,022,370 | 5/1977 | Durney | 228/191 |
| 4,426,571 | 1/1984 | Beck | 228/264 |
| 4,569,473 | 2/1986 | Guiliano | 228/264 |
| 4,620,659 | 11/1986 | Holdway | 228/191 |
| 4,659,004 | 4/1987 | Fridman | 228/8 |

FOREIGN PATENT DOCUMENTS

| | | | |
|---|---|---|---|
| 1943393 | 3/1971 | Fed. Rep. of Germany | 228/191 |
| 2925347 | 1/1981 | Fed. Rep. of Germany | 228/264 |
| 3427431 | 2/1986 | Fed. Rep. of Germany | 228/264 |

Primary Examiner—Nicholas P. Godici
Assistant Examiner—Samuel M. Heinrich
Attorney, Agent, or Firm—Lee A. Strimbeck

[57] ABSTRACT

The present invention proposes an apparatus or jig for the controlled spot heating of a substrate having soldered components therein and a designated locus to be heated for removal and/or replacement of a component. The apparatus comprises a frame and support means on the frame for holding and positioning the substrate with the locus to be heated along a designated axis of the frame. A rail at one end of the frame parallel to the designated axis holds a heating arm. The heating arm extends along an axis perpendicular to the designated axis and can be positioned along the rail. The heating arm ends in a directing means that is positioned over the designated axis and directs a heating medium, e.g. infra red radiation or a heated gas, onto a locus to be heated. The directing means limits the area of the application of the heating medium to only that area necessary for removal of the component. The amount, temperature, and time of application of the heating medium is controlled to just effect melting of the solder, after which application of the heating medium is discontinued and the component is removed. Preferably, a temperature sensor or thermocouple is associated with the directing means to measure the temperature of the heating medium and a timer is activated when the temperature of the heating medium is adequate to commence heating of the locus. Based on the experience of the operator, the timer is preset to allow the heating medium to be applied to the locus for a predetermined time sufficient to effect melting of the solder.

10 Claims, 2 Drawing Sheets

APPARATUS AND METHOD FOR THE REPAIR OF PRINTED CIRCUIT BOARDS

This invention is an apparatus and method for the controlled localized heating of printed circuit boards to permit the removal and repair of defective components.

INTRODUCTION

There has been a need for an apparatus and method for removing and reinstalling electronic components in printed circuit boards without damaging either the components of the board itself. Such components are attached to the substrate board by leads held by solder on the surface of the board or in openings in the boards. One way to remove a component is to melt the solder holding the leads of the component and pull it off or out. However, if the heating is not controlled, limited, and localized, the component being removed, an adjacent component, or the board itself, can be damaged.

There has been a desideratum for a hot gas system which permits accurate control of the rework/repair process by controlling temperature, gas flow and dwell time; which minimizes operator involvement in process control; and which is suited from a speed and tooling cost standpoint to the removal and replacement of randomly located components—a system that insures consistency and repeatability and causes as little loss of solder joint reliability as possible.

The present invention is addressed to this need.

THIS INVENTION

The present invention proposes an apparatus or jig for the controlled spot heating of a substrate having soldered components therein and a designated locus to be heated for removal and/or replacement of a component. The apparatus comprises a frame and support means on the frame for holding and positioning the substrate with the locus to be heated along a designated axis of the frame. A rail at one end of the frame parallel to the designated axis holds a heating arm. The heating arm extends along an axis perpendicular to the designated axis and can be positioned along the rail. The heating arm ends in a directing means that is positioned over the designated axis and directs a heating medium, e.g. infra red radiation or a heated gas, onto a locus to be heated. The directing means limits the area of the application of the heating medium to only that area necessary for removal of the component. The amount, temperature, and time of application of the heating medium is controlled to just effect melting of the solder, after which application of the heating medium is discontinued and the component is removed. Preferably, a temperature sensor or thermocouple is associated with the directing means to measure the temperature of the heating medium and a timer is activated when the temperature of the heating medium is adequate to commence heating of the locus. Based on the experience of the operator, the timer is preset to allow the heating medium to be applied to the locus for a predetermined time sufficient to effect melting of the solder.

Preferably the heating medium is either air or an inert gas supplied through the heating arm. The gas is heated by an electric resistance heater in the heating arm. The resistance heater is controlled by a temperature controller responsive to a thermocouple in the gas stream so that a predetermined temperature can be maintained. The flow of gas and the length of time the resistance heater remains on is controlled by a timer so that overheating of the board or its components may be avoided.

It has been found to be particularly advantageous to pulse the gas flow as this results in a better, more controlled heating. The pulsing while almost imperceptible allows the thermocouple to determine the temperature of the flowing gas more effectively and aids in the more rapid and precise heating of the solder.

THE DRAWINGS

In the drawings.

The same parts in the figures have the same number.

DESCRIPTION

Figure 1:
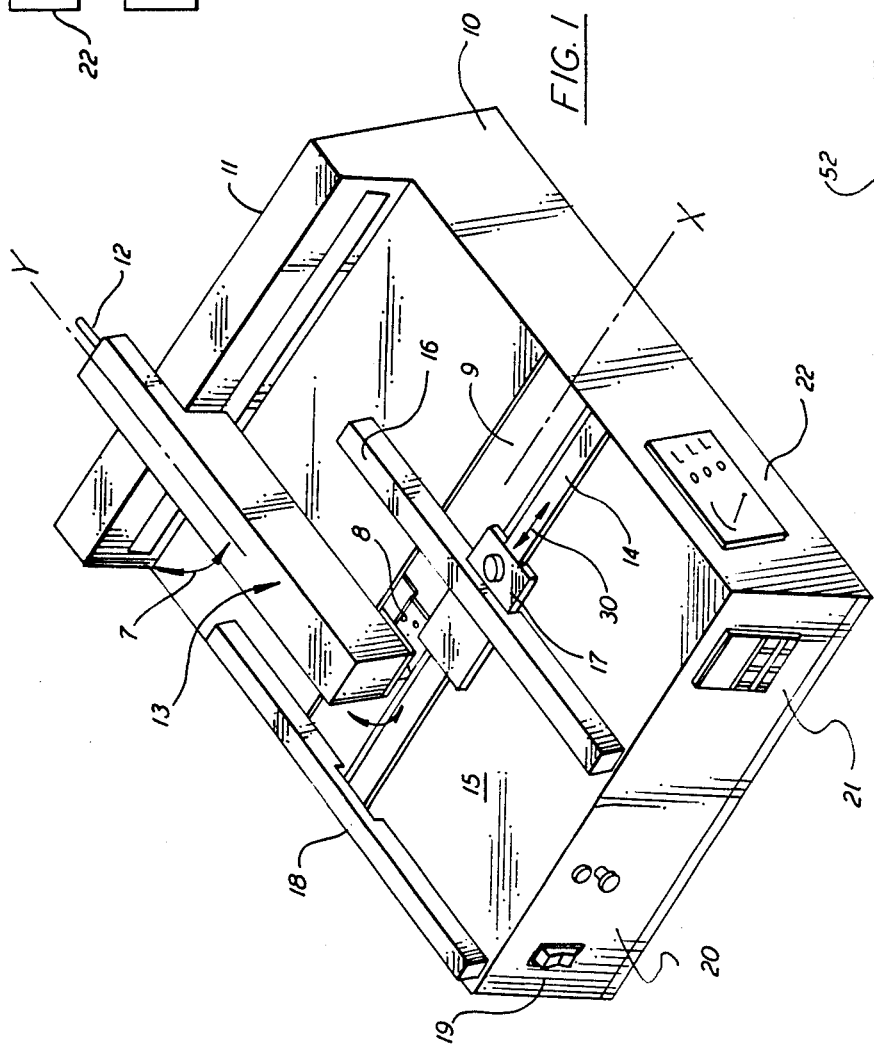
FIG. 1 is a prespective view of the apparatus for the jig of this invention.

With reference to FIG. 1, the apparatus of the invention comprises a frame 10 which has a top surface 15 and a back rail 11. Supported on surface 15 is a support rail or guide 18, which is fixed, a movable suport rail 16, and a guide 14 for rail 16. Supported on guide 14 is a bracket 17 which holds rail 16 rigidly but can slide back and forth on rail 14 as indicated by direction arrows 30. The bracket 17 may have a finger operated clamp or screw to secure it when positioned. Rail 14 is parallel to a predetermined axis on the frame, indicated as "X".

Rail 11 is parallel to axis "X" and supports a heating arm 13, the other end of which extends over axis "X". Heating arm 13 can be moved back and forth on rail 11 to permit alignment of the heating arm with the locus to be heated on the circuit board. Preferably, arm 13 can be pivoted upwardly, as indicated by direction arrow 7, away from the work.

In a preferred embodiment, surface 15 has an opening or slot 9 in it to permit a second heating arm, the end of which is shown at 8, to direct a heating medium against the underside of the substrate to be worked on. The two arms move in tandem on rail 11 for alignment over the locus.

Frame 10 contains the controls for the apparatus which consist of a power-on switch 19, a cycle start switch 20, a timer 21 which may be set by hand, and a temperature controller 22 which also may be set to give a predetermined temperature. Electric power and a gas, e.g. air, is supplied to the underside of heating arm 13 generally indicated at 12. The supply of these is shown schematically on FIG. 2. Heating arm 8 is similarly supplied.

Figure 2:
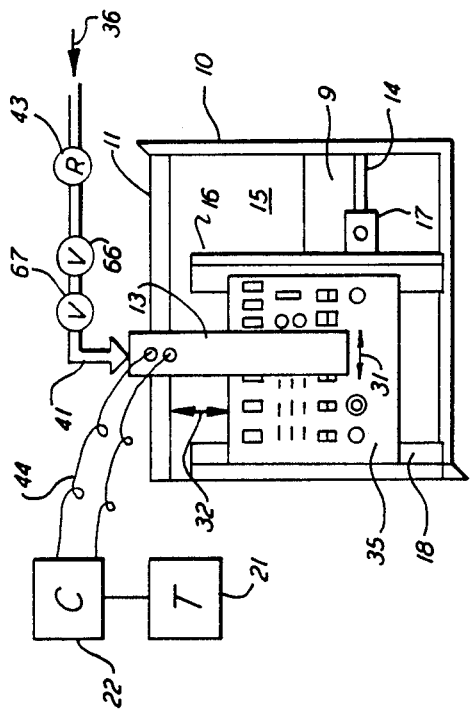
FIG. 2 is a schematic plan view of the apparatus showing a circuit board in place.
Figure 3:
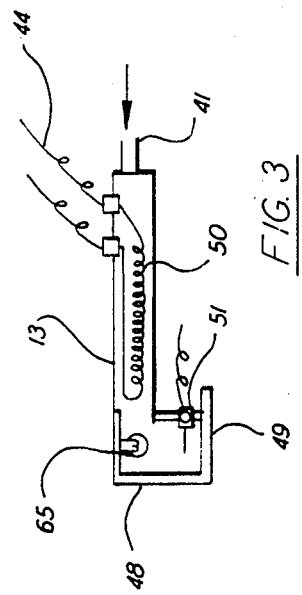
FIG. 3 is a side view of the upper heating element.
Figure 4:
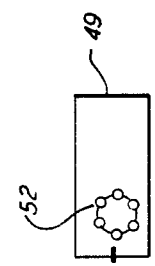
FIG. 4 is a view of a nozzle plate that may be used to direct the flow of heating gas from the heating arm and directing means onto the circuit board.

With reference to FIG. 2, a printed circuit board 35 is shown placed on supports 16 and 18 and positioned such that the locus to be heated is beneath the end of heating arm 13. The board can be slid up and down on the supports as indicated by arrows 32. The board is clamped in position by moving bracket 17 inwardly to hold the board as indicated by direction arrow 30. After so positions the board, heating arm 13 is moved along rail 11 until the end of the arm is over the locus to be heated. The axis of the arm, indicated as "Y" is perpendicular to axis "X".

While infra red or another heating medium can be used to heat the locus, the apparatus is illustrated in its preferred embodiment whereby a heated gas is passed through the heating arm to accomplish the heating. To this end, gas from source 36 is supplied through a regulator 43, an on/off solenoid valve 66, a cycling solenoid valve 67, and line 41 to the heating arm. It passes through the heating arm being heated by an electrical resistance element 50 and then is directed downwardly by a directing means 48 through an interchangeable nozzle plate 49 onto the locus to be heated. Nozzle plate 49 has a series of openings 52 configured to give the pattern of heating desired to accomplish removal of the electrical component while avoiding excessive heating of adjacent areas. Nozzle plate 49 slides within the end of directing means 48 such that it can be readily replaced with another plate having a suitable configuration for the task at hand. Plate 49 is quite thin so that it has a low heat capacity, i.e. little time is required to bring it up to the gas temperature. Also, as plate 49 does not hold heat after system deactivation, it can be changed for the next operation after cooling for only a few seconds.

Electric power is supplied to heating element 50 via leads 44 which connect to a temperature controller 22. Controller 22 is connected to timer 21. Timer 21 also is connected with solenoid valve 66 by a relay.

The cycle start switch 20 is also interconnected with the controller and valve 66 in a conventional manner.

A temperature sensing means or thermocouple 51 is inserted in the directing means 48 to measure the temperature of the flowing gas as it exits through nozzle plate 49. This temperature sensor is connected with controller 22.

Figure 5:
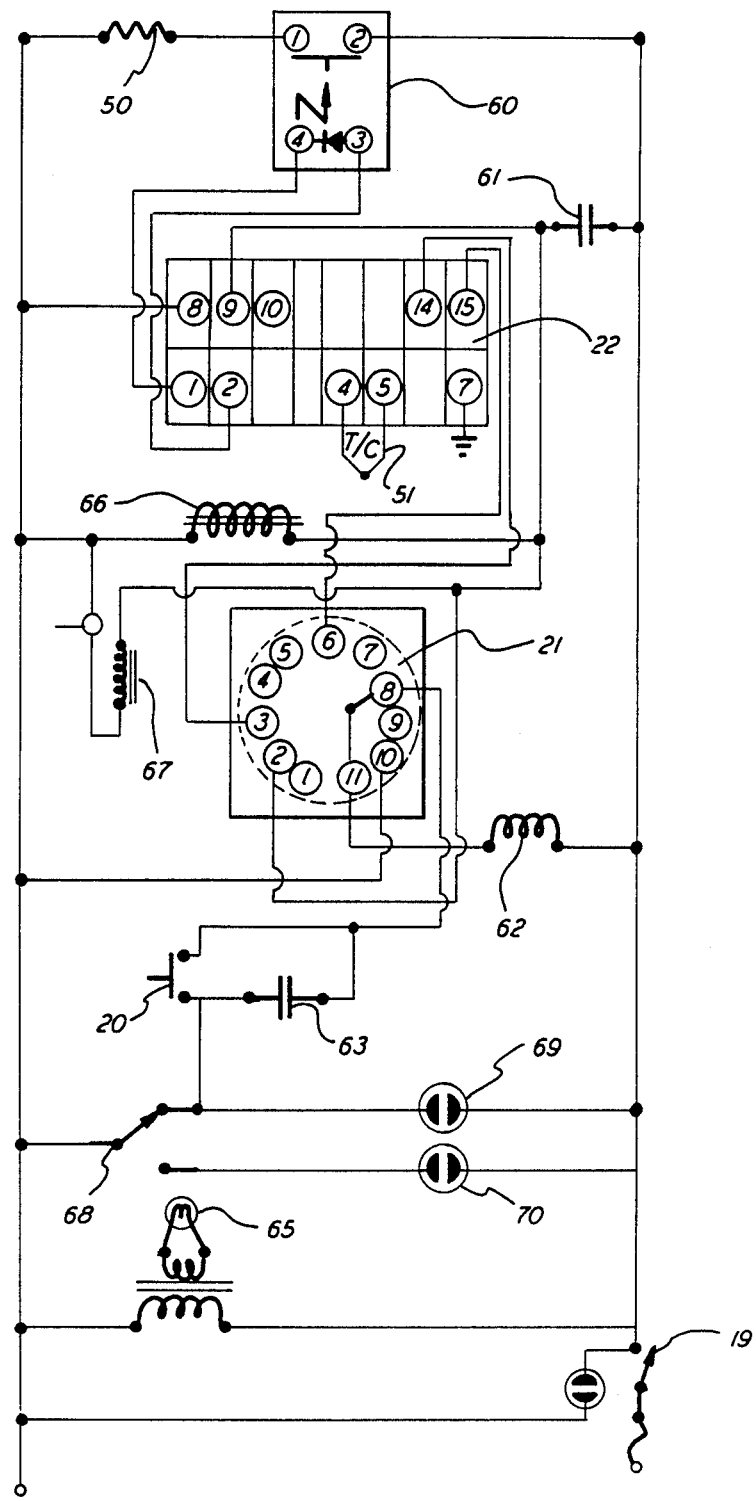
FIG. 5 is a schematic of the electrical system.

Turning to FIG. 5, the electrical system for the apparatus is illustrated schematically. Item 60 is a solid state relay that supplies the heating element 50. Item 22 is a proportioning solid state temperature controller. Items 61, 62 and 63 are contact relays and item 65 is a high intensity lamp. Item 67 is a half wave rectified cycling solenoid valve that effects pulsing of the gas flow. Item 68 is the switch for valve 66 and items 69 and 70 are the circuits for the air on the air off positions, respectively.

In operation board 35 and heating arm 13 is positioned as shown, such that the directing means 48 and the openings 52 in nozzle plate 49 are directly over the component to be heated and removed. A high intensity lamp 65 can be placed in directing means 48 and the light passing through the patterned holes in perforated plate 49 can be used by the operator to facilitate positioning. If a lower heating arm is being used, it is similarly positioned beneath the locus simultaneously with arm 13. A predetermined time is set on timer 21. This is determined by the experience of the operator. Controller 22 is set for the gas temperature to be used. Regulator 43 is set to deliver the heating gas, say air, at a predetermined pressure, e.g. to give a flow of 1 CFM.

The temperature to be used is determined empirically and relates in part to the type of gas being used and its rate of flow. However, it has been found, somewhat surprisingly, that although the nozzle plate 49 has to be changed frequently to accommodate different component configurations, it usually is not necessary to change the temperature setting or dwell time for most components. For exmaple, it has been found that settiing the temperature at 205° C. and the dwell time of 60 seconds is ideal for a variety of components, even ones much smaller than the nozzle plate was designed for. Because the temperature of the board never exceeded the 205° C. set point, a time of 1 minute or 6 minutes left the board in the same condition without discoloration or any deleterious effects.

When these controls have been set and the board positioned, the power switch is turned on and the cycle start switch is pushed. This causes valve 66 to open via switch 68, solenoid valve 67 to commence cycling to pulse the gas flow, and power to be supplied to heating element 50. The gas flowing past the heating element is heated and as it reaches the predetermined temperature as sensed by thermocouple 31, the timer is activated. The apparatus thereafter operates for the predetermined time set on the timer with the temperature controller holding the temperature of the gas being blown on to the locus of the board to that temperature found to be most appropriate to accomplish the melting of the solder on the leads of the component within the time set on the timer. After the time set on the timer has lapsed, the timer shuts down the heating element 50 and closes valve 66. This may be accompanied by an audible or light signal to advise the operator that the component in question is ready to be removed. The operator does so by sliding heating arm 13 to the side and removing the component or components. This can be done by the operator with tweezers. Alternatively, the directing means 48 can have a vacuum pick up associated with it such that when attached and heating arm 13 is raised, the component can be readily lifted from the board.

I claim:

1. Apparatus for controlled localized heating of a substrate having soldered components thereon and a designated locus to be heated for removal of a component, comprising:
   (a) a frame;
   (b) support means on said frame for holding and positioning said substrate on said frame, said support means permitting positioning of said locus along a designated axis of said frame;
   (c) a rail at one end of said frame parallel to said designated axis;
   (d) a heating arm extending along another axis perpendicular to said designated axis and supported by and positionable along said rail; and
   (e) directing means on said heating arm over said designated axis for directing a heating medium onto said locus when said heating arm is positioned thereover, said directing means being adapted to supply said heating medium in an amount, at a temperature, and for a time sufficient to raise the temperature of solder at said locus through the melting point thereof.

2. The apparatus of claim 1 wherein said heating arm comprises a conduit and includes heating means adapted to supply a flow of a heated gas as said heating medium.

3. The apparatus of claim 2 including gas supply means for supplying a flow of gas through a flow controller to said conduit, an electric resistance heater within said conduit adapted to heat said gas to a predetermined temperature, sensing means in said directing means to observe the temperature of said gas therein, and control means operatively associated with said sensing means and electric resistance heater to establish said predetermined temperature.

4. The apparatus of claim 3 comprising in addition timer means operatively connected to said control means, said timer means allowing said electric resistance heater to operate and said gas to flow for a predetermined time after said predetermined temperature is reached and then shutting off said electric resistance heater and flow.

5. The apparatus of claim 3 comprising means in said gas supply means for effecting a pulsating flow of said gas.

6. The apparatus of claim 1 having two of said heating arms each of which has a directing means, one of said heating arms being positioned above said substrate and the other below, and said heating arms being supported by and being adapted to move in tandem on said rail.

7. A process for the removal of a soldered component from a designated locus on a printed circuit board by spot heating of said locus, comprising in combination the steps of:
  (a) supporting said printed circuit board in a jig with said locus over a designated axis of said jig; said jig having a heating arm supported by and for movement along one edge of said jib, said heating arm extending over said printed circuit board perpendicular to said designated axis and having a directing means positioned over said designated axis;
  (b) positioning said directing means over said locus;
  (c) directing a heating medium by said directing means against said locus for a time, in an amount and at a temperature to effect melting of the solder at said locus;
  (d) then ceasing the application of said heating medium immediately after said melting occurs; and
  (e) removing said component.

8. The process of claim 7 wherein said heating medium is a flow of gas supplied through said heating arm and heated to a predetermined temperature by an electric resistance heater, said directing means having a temperature sensor adapted to sense the temperature of the gas passing therethrough; and comprising in addition the step of setting a predetermined time for said gas to flow and said electric resistance heater to operate after said predetermined temperature is reached as reported by said temperature sensor.

9. The process of claim 8 wherein said gas is an inert gas.

10. The process of claim 8 wherein said flow of gas is pulsed.

* * * * *